United States Patent
Liu et al.

(10) Patent No.: US 12,328,065 B2
(45) Date of Patent: Jun. 10, 2025

(54) METHOD FOR ESTIMATING PARAMETERS OF RESONANT CONVERTER, METHOD FOR CONTROLLING RESONANT CONVERTER AND RESONANT CONVERTER

(71) Applicant: Delta Electronics (Shanghai) Co., Ltd., Shanghai (CN)

(72) Inventors: Hong Liu, Shanghai (CN); Baihui Song, Shanghai (CN); Wen Zhang, Shanghai (CN); Wenfei Hu, Shanghai (CN); Cheng Lu, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 345 days.

(21) Appl. No.: 18/156,359

(22) Filed: Jan. 18, 2023

(65) Prior Publication Data

US 2023/0261568 A1    Aug. 17, 2023

(30) Foreign Application Priority Data

Feb. 14, 2022    (CN) .......................... 202210134339.5

(51) Int. Cl.
*H02M 3/335*    (2006.01)
*G01R 31/40*    (2020.01)
(Continued)

(52) U.S. Cl.
CPC .............. *H02M 3/01* (2021.05); *G01R 31/40* (2013.01); *H02M 1/0009* (2021.05); *H02M 3/33573* (2021.05); *H02M 3/33576* (2013.01)

(58) Field of Classification Search
CPC ............ H02M 3/22; H02M 1/08; H02M 1/36; H02M 3/24; H02M 3/325; H02M 3/335;
(Continued)

(56) References Cited

U.S. PATENT DOCUMENTS

| 4,951,185 A | * 8/1990 | Schutten | ............. H02M 3/3376 363/17 |
|---|---|---|---|
| 6,178,099 B1 | 1/2001 | Schutten et al. | |

(Continued)

FOREIGN PATENT DOCUMENTS

| CN | 101483385 A | 7/2009 |
|---|---|---|
| CN | 110456165 A | 11/2019 |

(Continued)

OTHER PUBLICATIONS

Shi Lin et al., "Burst-Mode and Phase-Shift Hybrid Control Method of LLC Converters for Wide Output Range Applications", IEEE Transactions on Industrial Electronics, IEEE Service Center, Piscataway, NJ, USA, vol. 67, No. 2, Feb. 1, 2020, pp. 1013-1023.

(Continued)

*Primary Examiner* — Jeffrey A Gblende
(74) *Attorney, Agent, or Firm* — CKC & Partners Co., LLC

(57) ABSTRACT

The disclosure discloses a method for estimating parameters of a resonant converter. The resonant converter has first, second port, and a resonant tank that includes an equivalent resonant capacitor and an equivalent resonant inductor, the method including: estimating a second voltage estimation value of the second port, an equivalent resonant capacitor estimation value, and/or an equivalent resonant inductor estimation value of the resonant converter according to a first voltage of the first port, an equivalent resonant capacitor voltage and an equivalent resonant inductor current of at least three effective points, wherein the points have different coordinates on a state plane of the equivalent resonant capacitor voltage and the equivalent resonant inductor current, and are on a state trajectory formed by the equivalent resonant capacitor voltage and the equivalent resonant
(Continued)

inductor current, and the points are not central symmetric about a center of the state trajectory.

27 Claims, 15 Drawing Sheets

(51) Int. Cl.
*H02M 1/00* (2006.01)
*H02M 3/00* (2006.01)

(58) Field of Classification Search
CPC ...... H02M 3/28; H02M 3/01; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H02M 3/33561; H02M 3/155; H02M 3/1582; H02M 1/4233; H02M 1/12; H02M 3/07; H02M 7/219; H02M 7/4815; H02M 1/0048; H02M 7/4818; H02M 7/4826; H02M 7/4833; Y02B 70/1491

See application file for complete search history.

(56) References Cited

U.S. PATENT DOCUMENTS

| | | | |
|---|---|---|---|
| 6,337,801 B2 * | 1/2002 | Li | H02M 7/48 363/137 |
| 9,287,795 B2 | 3/2016 | Ma et al. | |
| 9,318,946 B2 * | 4/2016 | Feng | H02M 3/3376 |
| 9,425,700 B2 * | 8/2016 | Lu | H02M 3/3376 |

FOREIGN PATENT DOCUMENTS

| | | |
|---|---|---|
| CN | 112172554 A | 1/2021 |
| WO | 2015173053 A1 | 11/2015 |

OTHER PUBLICATIONS

Gilbert Adam John: "Analysis, design and control of ICC resonant power converters", Jan. 1, 2007, chapter 7, section 7.3, XP093057468, Retrieved from the Internet: URL: https://etheses.whiterose.ac.uk/15028/1/633052.pdf [retrieved on Jun. 23, 2023].

* cited by examiner estimating a second voltage estimation value of the second port, an equivalent resonant capacitor estimation value, and/or an equivalent resonant inductor estimation value of the resonant converter according to a first voltage of the first port, an equivalent resonant capacitor voltage and an equivalent resonant inductor current of at least three effective points, wherein the at least three effective points have different coordinates on a state plane of the equivalent resonant capacitor voltage and the equivalent resonant inductor current, and are on a state trajectory formed by the equivalent resonant capacitor voltage and the equivalent resonant inductor current, and the at least three effective points are not central symmetric about a center of the state trajectory — S201

Fig.2 the effective sampling points only in a positive half period or a negative half period the effective sampling points in a positive half period and a negative half period $v_{Cr}$ and $i_{Lr}$ form an elliptical trajectory a trajectory of $V_{CrN}$ and $i_{LrN}$ after normalization

900 configuring a double closed-loop controller having a voltage feedback terminal on an outer loop and configured to receive a voltage signal for reflecting an output voltage at an output port of the resonant converter, and a current feedback terminal on an inner loop and configured to receive an estimation value of a resonant current average value in a half switching period obtained by estimation using the method for estimating parameters, wherein a voltage value of the voltage signal is an output voltage sampling value sampled from the output port, or a second voltage estimation value obtained by estimation using the method for estimating parameters as an output voltage estimation value; — S901 when the output voltage sampling value can be sampled, the double closed-loop controller receives the output voltage sampling value through the voltage feedback terminal, and controls a primary switching frequency of primary switches in a primary circuit of the resonant converter; — S902 when the output voltage sampling value cannot be sampled, the double closed-loop controller receives the output voltage estimation value through the voltage feedback terminal, and controls the primary switching frequency of the primary switches. — S903

Fig.9A

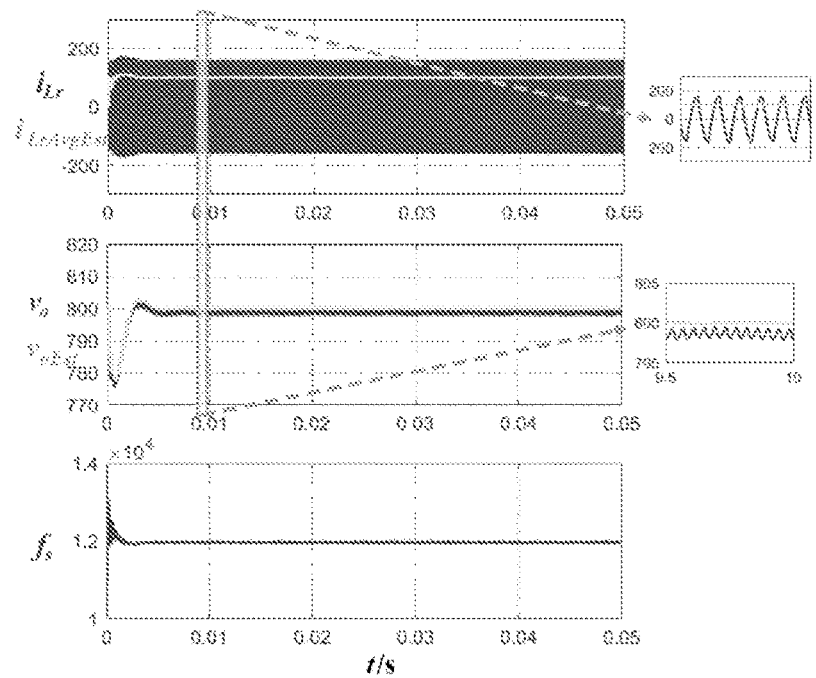
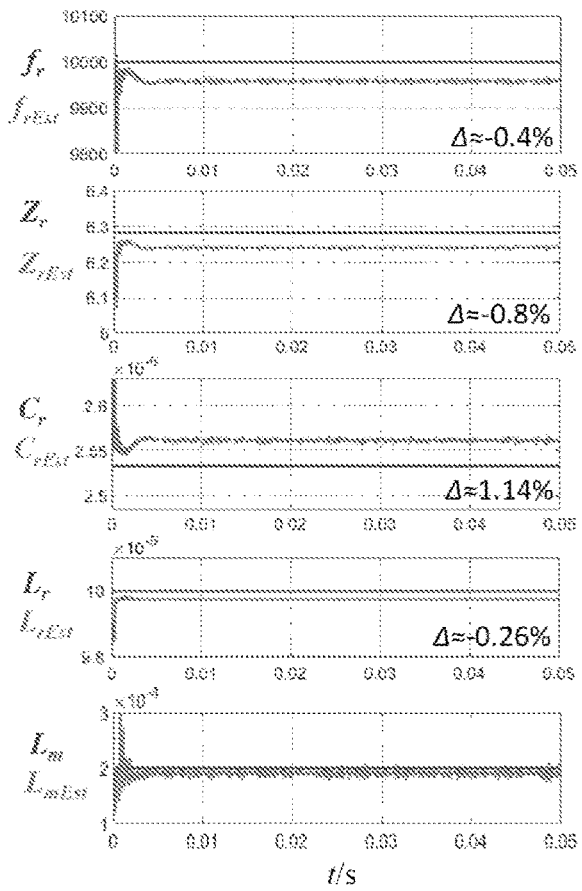
Fig.14

METHOD FOR ESTIMATING PARAMETERS OF RESONANT CONVERTER, METHOD FOR CONTROLLING RESONANT CONVERTER AND RESONANT CONVERTER

CROSS-REFERENCE TO RELATED APPLICATIONS

This non-provisional application claims priority under 35 U.S.C. § 119(a) on Patent Application No. 202210134339.5 filed in P.R. China on Feb. 14, 2022, the entire contents of which are hereby incorporated by reference.

Some references, if any, which may include patents, patent applications and various publications, may be cited and discussed in the description of this disclosure. The citation and/or discussion of such references, if any, is provided merely to clarify the description of the present disclosure and is not an admission that any such reference is "prior art" to the disclosure described herein. All references listed, cited and/or discussed in this specification are incorporated herein by reference in their entireties and to the same extent as if each reference was individually incorporated by reference.

BACKGROUND OF THE INVENTION

1. Field of the Invention

The disclosure relates to the technology of converter, and particularly to a method for estimating parameters of a resonant converter, a method for controlling a resonant converter and a resonant converter.

2. Related Art

A high-frequency resonant converter is applied to a Solid State Transformer (SST), and has a wide application prospect in DC power utilization or generation fields such as data center, charging station of the electric vehicle, photovoltaic and energy storage.

In the above application scenarios, the SST inputs a medium voltage alternating current, outputs a low voltage directing voltage, and includes a pre-stage AC-DC converter and a post-stage DC-DC converter. In the DC-DC converter of the SST, generally, a primary medium voltage side and a secondary low voltage side of a high-frequency transformer shall be isolated. Moreover, fiber optic communication connection of the primary and secondary sides in the available SST is complicated, and frequency modulation control of the primary side is dependent on fiber optic communication between the primary and secondary sides. When there is no communication or communication failure between the primary side and secondary side, the system may be ensured to still operate stably by estimating the output voltage $V_o$, thereby reducing dependency of control on communication. Moreover, the actual parameters of the resonant converter are affected by temperature and working conditions, and the design value is deviated, thereby affecting control performance. Estimating parameters such as the equivalent resonant inductor $L_r$, the equivalent resonant capacitor $C_r$ and the magnetic inductor $L_m$ of the resonant converter, can reflect the changes of the circuit in time, adjust the control parameters, facilitate fault diagnosis and fault-tolerant operation of the resonant converter. Therefore, as for improving control performance and reliability of the SST, estimation of the parameters of the resonant converter has an important significance.

The prior art further discloses some methods for estimating parameters in a frequency domain, but these methods have some limitations.

SUMMARY OF THE INVENTION

An object of the disclosure is to provide a method for estimating parameters of a resonant converter, a method for controlling a resonant converter and a resonant converter, which can effectively solve at least one deficiency of the prior art, improves operational reliability of the resonant converter, and satisfies requirement for efficient operation of the system when there is no communication between the primary and secondary sides.

In order to achieve the object, the disclosure provides a method for estimating parameters of a resonant converter, wherein the resonant converter includes a first port, a second port, and a resonant tank that includes an equivalent resonant capacitor and an equivalent resonant inductor, the method including: estimating a second voltage estimation value of the second port, an equivalent resonant capacitor estimation value, and/or an equivalent resonant inductor estimation value of the resonant converter according to a first voltage of the first port, an equivalent resonant capacitor voltage and an equivalent resonant inductor current of at least three effective points, wherein the at least three effective points have different coordinates on a state plane of the equivalent resonant capacitor voltage and the equivalent resonant inductor current, and are on a state trajectory formed by the equivalent resonant capacitor voltage and the equivalent resonant inductor current, and the at least three effective points are not central symmetric about a center of the state trajectory.

In order to achieve the object, the disclosure further provides a method for controlling a resonant converter, including:

configuring a double closed-loop controller having a voltage feedback terminal on an outer loop and configured to receive a voltage signal for reflecting an output voltage at an output port of the resonant converter, and a current feedback terminal on an inner loop and configured to receive an estimation value of a resonant current average value in a half switching period obtained by estimation according to the method for estimating parameters, wherein a voltage value of the voltage signal is an output voltage sampling value sampled from the output port, or a second voltage estimation value obtained by estimation using the method for estimating parameters as an output voltage estimation value;

when the output voltage sampling value can be sampled, the double closed-loop controller receives the output voltage sampling value through the voltage feedback terminal, and controls a primary switching frequency of primary switches in a primary circuit of the resonant converter;

when the output voltage sampling value cannot be sampled, the double closed-loop controller receives the output voltage estimation value through the voltage feedback terminal, and controls the primary switching frequency of the primary switches.

In order to achieve the object, the disclosure further provides a resonant converter having a first port, a second port, and a resonant tank, wherein the resonant tank includes an equivalent resonant capacitor and an equivalent resonant inductor, and the resonant converter further includes: an estimation unit configured to perform the method for estimating parameters to obtain a second voltage estimation value of the second port, an equivalent resonant capacitor estimation value, and/or an equivalent resonant inductor estimation value of the resonant converter.

The disclosure may estimate parameters of the resonant converter using the state trajectory in time domain.

The disclosure may design the double closed-loop controller to stably control the output voltage, and is adapted to non-communication control between the primary and secondary sides of the resonant converter according to the output voltage estimation value of the resonant converter and the estimation value of the resonant current average value in the half switching period.

The additional aspects and advantages of the disclosure are partially explained in the below description, and partially becoming apparent from the description, or can be obtained through the practice of the disclosure.

BRIEF DESCRIPTION OF THE DRAWINGS

The exemplary embodiments are described in details with reference to the accompanying drawings, through which the above and other features and advantages of the disclosure will become more apparent.

FIG. 2 is a flow diagram of a method for estimating parameters of a resonant converter according to the disclosure.

FIG. 9A is a flow diagram of a method for controlling a resonant converter according to the disclosure.

FIG. 14 illustrates control effect of the disclosure when parameters of the resonant tank are consistent with a design value.

DETAILED EMBODIMENTS OF THE INVENTION

Figure 1:
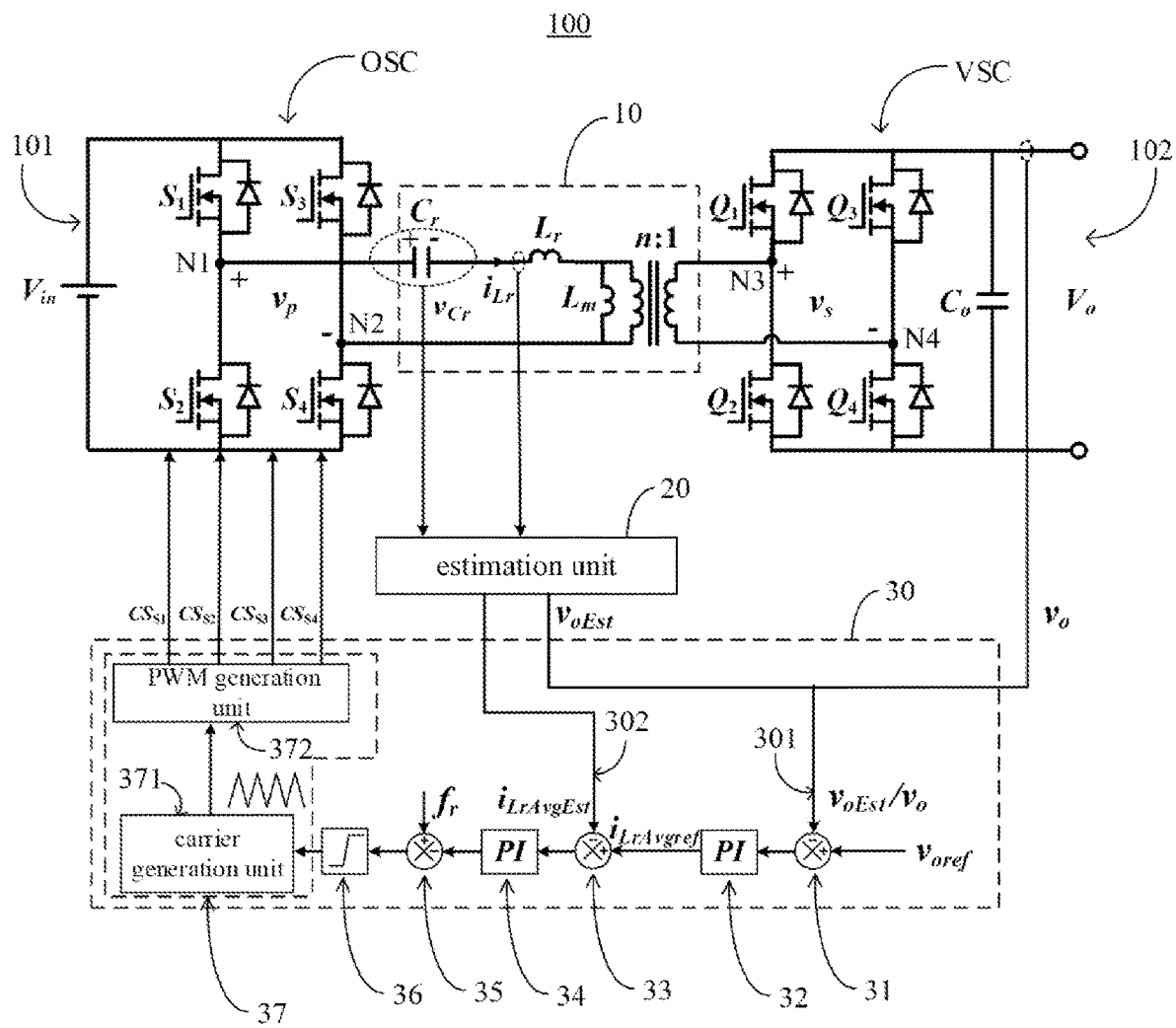
FIG. 1 is a topology and a control block diagram of a resonant converter according to the disclosure.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this disclosure will be thorough and complete, and the conception of exemplary embodiments will be fully conveyed to those skilled in the art. In the drawings, the same reference sign denotes the same or similar structure, so their detailed description will be omitted.

When factors/components/the like described and/or illustrated here are introduced, the phrases "one", "a(an)", "the", "said" and "at least one" refer to one or more factors/components/the like. The terms "include", "comprise" and "have" refer to an open and included meaning, and refer to additional factors/components/the like, in addition to the listed factors/components/the like. In addition, the terms "first", "second" and the like in the claims are only used as signs, instead of numeral limitations to objects.

FIG. 1 illustrates a circuit topology and a control block diagram of a resonant converter 100 according to the disclosure. As shown in FIG. 1, the resonant converter 100 of the disclosure has a first port 101 and a second port 102, and may include a resonant tank 10. The first port 101 may be an input port of the resonant converter for receiving an input voltage $V_{in}$. The second port 102 may be an output port of the resonant converter for outputting an output voltage $V_o$. The resonant tank 10 may include an equivalent resonant capacitor $C_r$ and an equivalent resonant inductor $L_r$, and a turn ratio of a primary side and a secondary side of the transformer, for example, may be n:1. In the disclosure, the resonant converter 100 may further include an estimation unit 20 configured to perform a method for estimating parameters (which will be further described in details subsequently) to obtain a second voltage estimation value $v_{oEst}$ (sometimes also referred to as "an output voltage estimation value") of the second port 102, an equivalent resonant capacitor estimation value $C_{rEst}$, and/or an equivalent resonant inductor estimation value $L_{rEst}$ of the resonant converter.

In the disclosure, the resonant converter 100 may have a primary circuit OSC on a primary side and a secondary circuit VSC on a secondary side. The primary circuit OSC, for example, may be a fully-controlled H-bridge or series half-bridge (SHB) topology, and the secondary circuit VSC, for example, may be an uncontrolled rectifier or synchronous rectifier. However, it can be understood that in other embodiments, the primary circuit OSC and the secondary circuit VSC also can be other circuit topologies, but the disclosure is not limited thereto.

In the embodiment of FIG. 1, the primary circuit OSC may have a plurality of primary switches, for example, including a first controllable switching tube $S_1$, a second controllable switching tube $S_2$, a third controllable switching tube $S_3$ and a fourth controllable switching tube $S_4$, the first controllable switching tube $S_1$ and the second controllable switching tube $S_2$ are connected in series to form a first primary bridge arm, the third controllable switching tube $S_3$ and the fourth controllable switching tube $S_4$ are connected in series to form a second primary bridge arm, and the first primary bridge arm and the second primary bridge arm are connected in parallel. A middle point N1 of the first primary bridge arm and a middle point N2 of the second primary bridge arm are connected to a first end of the resonant tank 10. The voltage between the middle point N1 of the first primary bridge arm and the middle point N2 of the second primary bridge arm is primary bridge arm voltage $v_p$.

In the embodiment of FIG. 1, the secondary circuit VSC may have a plurality of secondary switches, for example, including a first switching tube $Q_1$, a second switching tube $Q_2$, a third switching tube $Q_3$ and a fourth switching tube $Q_4$, the first switching tube $Q_1$ and the second switching tube $Q_2$ are connected in series to form a first secondary bridge arm, the third switching tube $Q_3$ and the fourth switching tube $Q_4$ are connected in series to form a second secondary bridge arm, and the first secondary bridge arm and the second secondary bridge arm are connected in parallel. A middle point N3 of the first secondary bridge arm and a middle point N4 of the second secondary bridge arm are connected to a second end of the resonant tank 10. The voltage between middle point N3 of the first secondary bridge arm and the middle point N4 of the second secondary bridge arm is secondary bridge arm voltage $v_s$. The secondary side of the resonant converter 100 further has an output capacitor $C_o$ connected in parallel to the first secondary bridge arm and the second secondary bridge arm.

In some embodiments of the disclosure, the resonant tank 10 may further include a magnetic inductor $L_m$, i.e., the resonant converter 100, for example, may be a LLC resonant converter. The estimation unit 20 may be further configured to perform a method for estimating parameters (which will be further described in details subsequently) to obtain a magnetic inductor estimation value $L_{mEst}$ of the resonant converter. Still further, the estimation unit 20 may be further configured to perform the method for estimating parameters to obtain an estimation value $i_{LrAvgEst}$ of a resonant current average value in a half switching period of the resonant converter.

In some embodiments of the disclosure, the resonant converter 100 may further include a double closed-loop controller 30. The double closed-loop controller 30 has a voltage feedback terminal 301 and a current feedback terminal 302. The voltage feedback terminal 301 may be on an outer loop and configured to receive a voltage signal for reflecting the output voltage $V_o$, and a voltage value of the voltage signal is an output voltage sampling value $v_o$ sampled from an output port (i.e., a second port 102), or a second voltage estimation value $v_{oEst}$ obtained by estimation using the method for estimating parameters as an output voltage estimation value (for purpose of explanation, "the output voltage estimation value" and "the second voltage estimation value" mentioned subsequently may use the same sign "$v_{oEst}$"). The current feedback terminal 302 may be on an inner loop and configured to receive the estimation value $i_{LrAvgEst}$ of the resonant current average value in the half switching period of the resonant converter 100. When the output voltage sampling value $v_o$ can be sampled, the double closed-loop controller 30 receives the output voltage sampling value $v_o$ through the voltage feedback terminal 301, and controls primary switching frequencies of a plurality of primary switches in the primary circuit OSC of the resonant converter 100. When the output voltage sampling value $v_o$ (including but not limited to no communication between primary and secondary sides of the resonant converter) cannot be sampled, the double closed-loop controller 30 receives the output voltage estimation value $v_{oEst}$ through the voltage feedback terminal 301, and controls the primary switching frequencies of the plurality of primary switches in the primary circuit OSC of the resonant converter 100.

In some embodiments, the double closed-loop controller 30, for example, may control the first controllable switching tube $S_1$ and the fourth controllable switching tube $S_4$ to be synchronous, and control the second controllable switching tube $S_2$ and the third controllable switching tube $S_3$ to be synchronous. The first controllable switching tube $S_1$ and the second controllable switching tube $S_2$ are turned on complementarily according to 50% of a duty cycle. The third controllable switching tube $S_3$ and the fourth controllable switching tube $S_4$ are turned on complementarily according to 50% of a duty cycle. Of course, it can be understood that it is also feasible to control using other proportion of the duty cycle, but the disclosure is not limited thereto.

In the embodiment of FIG. 1, the double closed-loop controller 30, for example, may include a voltage comparison module 31, a first regulator 32, a current comparison module 33, a second regulator 34, a frequency comparison module 35, a limiter 36 and a carrier generation module 37. An output end of the voltage comparison module 31 is connected to an input end of the current comparison module 33 via the first regulator 32 for comparing the voltage signal (e.g., the output voltage sampling value $v_o$ or the output voltage estimation value $v_{oEst}$) and an output voltage reference signal $v_{oref}$, outputting a reference signal $i_{LrAvgref}$ of a resonant current average value in a half switching period after regulation of the first regulator 32, and transmitting to the current comparison module 33. An output end of the current comparison module 33 is connected to an input end of the frequency comparison module 35 via the second regulator 34 for comparing the reference signal $i_{LrAvgref}$ of the resonant current average value in the half switching period and an estimation value $i_{LrAvgEst}$ of the resonant current average value in the half switching period, outputting a regulation signal after regulation of the second regulator 34, and transmitting to the frequency comparison module 35. An output end of the frequency comparison module 35 is connected to an input end of the carrier generation module 37 via the limiter 36 for comparing a frequency of the regulation signal and an initial switching frequency $f_r$ (i.e., the resonant frequency) of the resonant converter, outputting a limiting signal after limitation of the limiter 36, and transmitting to the carrier generation module 37. The carrier generation module 37 is configured to generate a plurality of driving signals based on the limiting signal to drive the plurality of primary switches, respectively, for example, generating driving signals $CS_{S1}$, $CS_{S2}$, $CS_{S3}$ and $CS_{S4}$ to drive the first controllable switching tube $S_1$, the second controllable switching tube $S_2$, the third controllable switching tube $S_3$ and the fourth controllable switching tube $S_4$.

Preferably, the carrier generation module 37, for example, may include a carrier generation unit 371 and a PWM generation unit 372. The carrier generation unit 371 may be configured to generate a triangular carrier wave based on the limiting signal, and the PWM generation unit 372 may be configured to generate the plurality of driving signals $CS_{S1}$, $CS_{S2}$, $CS_{S3}$ and $CS_{S4}$ based on the triangular carrier wave to drive the plurality of primary switches, respectively.

As shown in FIG. 2, with reference to the resonant converter 100 shown in FIG. 1, a method 200 for estimating parameters of the resonant converter provided in the disclosure includes:

step S201, estimating a second voltage estimation value $v_{oEst}$ of the second port 102, an equivalent resonant capacitor estimation value $C_{rEst}$, and/or an equivalent resonant inductor estimation value $L_{rEst}$ of the resonant converter according to a first voltage (e.g., an input voltage $V_{in}$ in FIG. 1) of the first port 101, an equivalent resonant capacitor voltage $v_{Cr}$ and an equivalent resonant inductor current $i_{Lr}$ of at least three effective points, wherein the at least three effective points have different coordinates on a state plane of the equivalent resonant capacitor voltage and the equivalent resonant inductor current, and are on a state trajectory formed by the equivalent resonant capacitor voltage and the equivalent resonant inductor current, and the at least three effective points are not central symmetric about a center of the state trajectory.

In the disclosure, the at least three effective points may be obtained by sampling, i.e., sampling the resonant capacitor voltage and the resonant inductor current of at least three effective sampling points. The effective sampling points may be defined in all sampling points, and every two sampling points cannot have an interval of $$\frac{m-1}{2}T_s,$$

where m is a positive integer (i.e., m=1, 2, 3, ... ), and $T_s$ is a switching period of the resonant converter. Moreover, in some embodiments, the resonant capacitor voltage and the resonant inductor current may be synchronously sampled at each of the effective sampling points correspondingly.

When the second voltage estimation value $v_{oEst}$ is estimated, energy function of the resonant tank may be constructed, and a trajectory equation of the state trajectory of the resonant capacitor voltage and the resonant inductor current on the state plane may be obtained according to a state equation of the resonant capacitor voltage and the resonant inductor current in time domain when the resonant converter works or starts. Then, the second voltage estimation value $v_{oEst}$ is estimated according to the trajectory equation and the at least three effective points.

Figure 3:
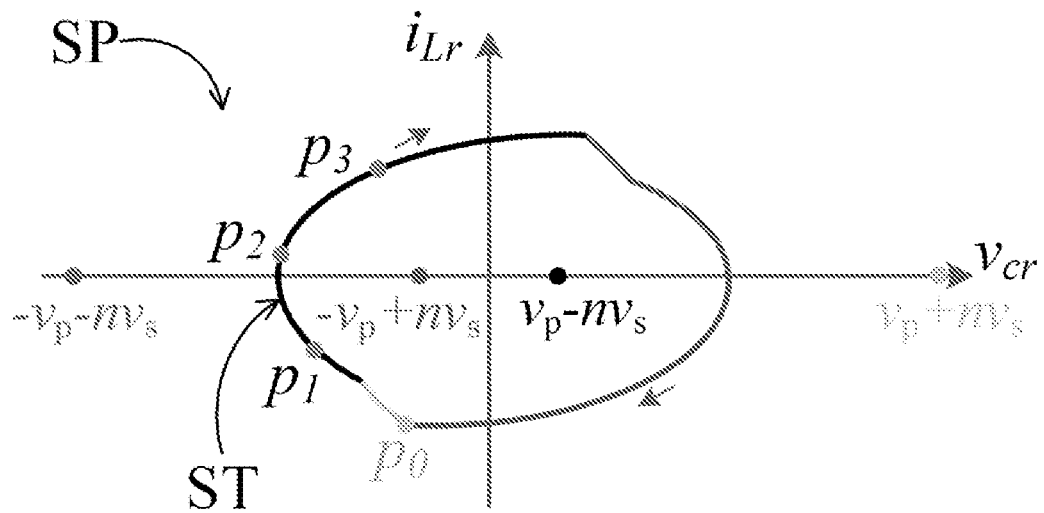
FIG. 3 is a schematic diagram of a state trajectory of an equivalent resonant capacitor voltage $v_{Cr}$ and an equivalent resonant inductor current $i_{Lr}$ when a switching frequency $f_s$>a resonant frequency $f_r$.

As shown in FIG. 3, it illustrates a state trajectory of an equivalent resonant capacitor voltage $v_{Cr}$ and an equivalent resonant inductor current $i_{Lr}$ in the method for estimating parameters according to the disclosure.

In FIG. 3, an interval time $T_d$ is sequentially delayed to sample the resonant capacitor voltage (e.g., the equivalent resonant capacitor voltage $v_{Cr}$ of the equivalent resonant capacitor $C_r$ in FIG. 1) and the resonant current (e.g., the equivalent resonant inductor current $i_{Lr}$ flowing the equivalent resonant inductor $L_r$ in FIG. 1) starting from a rising edge of a primary bridge arm voltage $v_p$ (corresponding to a sampling point $p_0$ in FIG. 3, also may be slightly delayed, such as, lagging a first lag time), and the resonant capacitor voltage and the resonant current are sampled at least three effective sampling points (e.g., including a sampling point $p_1$, a sampling point $p_2$, and a sampling point $p_3$).

Moreover, when a sampling rate is high, three samplings may be performed once in a half switching period, and the embodiment shown in FIG. 3 is to sample in a positive half period. If the sampling rate cannot achieve the requirement, sampling may be performed in a plurality of switching periods, but the disclosure is not limited thereto.

In this embodiment, assuming that coordinates of the sampling points is $p_i(x_i, y_i)$, where i=1 to 3, and the resonant capacitor voltage and the resonant current are synchronously sampled at each sampling point correspondingly. According to an elliptic equation of an elliptic arc $\widehat{p_1p_2p_3}$, an output voltage estimation value $$v_{oEst} = \frac{V_{in} - c}{n}$$

may be estimated, where $$c = \frac{1}{2}\frac{(x_1^2 - x_2^2)(y_2^2 - y_3^2) - (x_2^2 - x_3^2)(y_1^2 - y_2^2)}{(x_1 - x_2)(y_2^2 - y_3^2) - (x_2 - x_3)(y_1^2 - y_2^2)}.$$

Detailed processes of parameter estimation will be further explained in details subsequently.

The method for estimating parameters in the disclosure also may sample in a negative half period, or in a plurality of switching periods, and the principle is the same as that of the embodiment when sampling in the positive half period shown in FIG. 3, so the details are not described here.

An accuracy of the disclosure is higher than that of the fundamental wave equivalent method using a frequency domain in the prior art through estimation parameters of the elliptical trajectory using the time domain. Moreover, the disclosure may estimate an output voltage, and is applicable to scenarios where the primary and secondary sides do not communicate.

Hereinafter the method for estimating parameters in the disclosure is further explained in details.

Figure 4A:
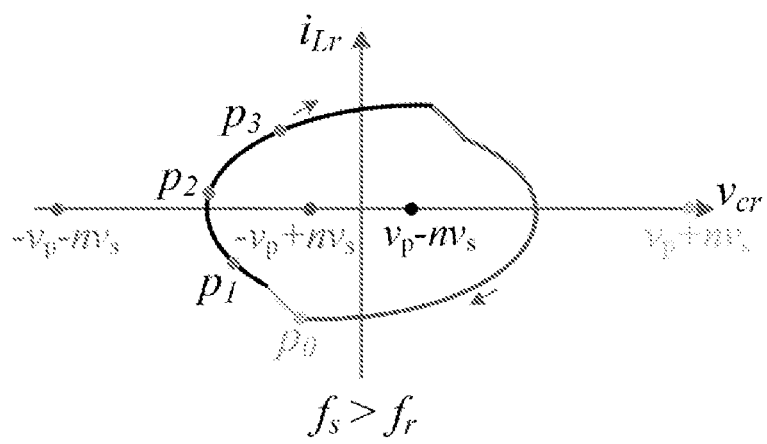
FIGS. 4A-4C are schematic diagrams of state trajectories sampled by a resonant tank under different switching frequencies such as the switching frequency $f_s$>the resonant frequency $f_r$, the switching frequency $f_s$=the resonant frequency $f_r$, and the switching frequency $f_s$<the resonant frequency $f_r$.
Figure 4B:
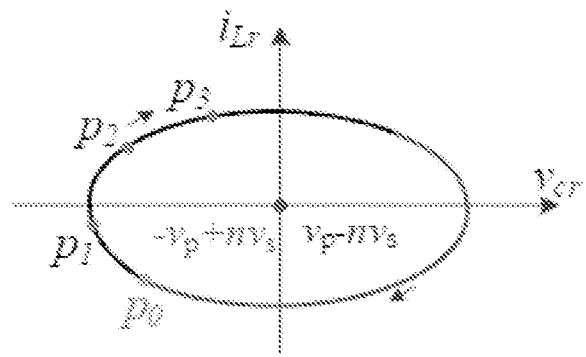
Figure 4C:
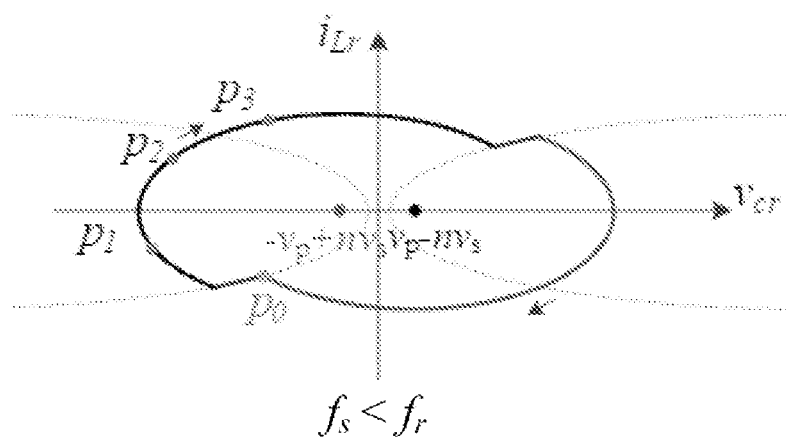

(I) Explanation of Sampling and the Method for Estimating an Output Voltage (1) when switching frequencies are different, Taking sampling in a positive half period for example, FIGS. 4A to 4C give a sampling method of the resonant tank under different switching frequencies. FIGS. 4A to 4C illustrate state trajectories sampled by the resonant tank under different switching frequencies such as the switching frequency $f_s$>the resonant frequency $f_r$, the switching frequency $f_s$=the resonant frequency $f_r$, and the switching frequency $f_s$<the resonant frequency $f_r$. The disclosure may estimate the output voltage through at least three effective sampling points, i.e., obtaining the output voltage estimation value $v_{oEst}$ through estimation. Hereinafter explanation is made taking three effective sampling points for example.

In FIGS. 4A to 4C, the sampling point $p_0$ corresponds to a rising edge of the primary bridge arm voltage $v_p$, and sampling may be sequentially performed every interval time $T_d$ after detecting the rising edge of the primary bridge arm voltage $v_p$, i.e., sampling at sampling points $p_1$, $p_2$ and $p_3$. The principle of sampling in a negative half period is the same, and the details are not described here. Under different switching frequencies $f_s$, the sampling points $p_1$, $p_2$ and $p_3$ are on the elliptic arc $\overline{p_1 p_2 p_3}$ when power is transmitted from the primary side to the secondary side, so a calculation method of the output voltage estimation value $v_{oEst}$ is the same.

In the disclosure, when the LLC resonant converter shown in FIG. 1 works, a state equation of the resonant capacitor voltage $v_{Cr}$ and the resonant current $i_{Lr}$ in time domain is as follows:

$$\begin{cases} C_r \dfrac{dv_{Cr}}{dt} = i_{Lr} \\ L_r \dfrac{di_{Lr}}{dt} = -v_{Cr} + v_p - nv_s \end{cases} \quad (1)$$

When constructing an energy function of the resonant tank $$E(t) = \frac{1}{2} C_r [v_{Cr} - (v_p - nv_s)]^2 + \frac{1}{2} L_r i_{Lr}^2,$$

it can be easily obtained that $$\frac{dE(t)}{dt} = 0.$$

Therefore, a waveform of the resonant capacitor voltage $v_{Cr}$ and the resonant current $i_{Lr}$ is an elliptic arc with a focal point on a horizontal axis:

$$\frac{[v_{Cr} - (v_p - nv_s)]^2}{2E(0)\dfrac{1}{C_r}} + \frac{i_{Lr}^2}{2E(0)\dfrac{1}{L_r}} = 1 \quad (2)$$

where $E(0)$ is an initial energy of the resonant tank, and the formula (2) is modified to a standard elliptic equation:

$$\frac{(x-c)^2}{a^2} + \frac{y^2}{b^2} = 1 (a > b > 0) \quad (3)$$

where $a^2 = \dfrac{2E(0)}{C_r}$, $b^2 = \dfrac{2E(0)}{L_r}$, and $c = v_p - nv_s$.

Since an essential change of LLC control (frequency modulation/phase shift) is a voltage added to both ends of the resonant tank, i.e., $v_p - nv_s$, then $v_{Cr}$ and $i_{Lr}$ are changed, causing change of the trajectory. The coordinates of the sampling points $p_1$, $p_2$ and $p_3$ are placed into the elliptic equation (3) to obtain:

$$\begin{cases} c = \dfrac{1}{2} \dfrac{(x_1^2 - x_2^2)(y_2^2 - y_3^2) - (x_2^2 - x_3^2)(y_1^2 - y_2^2)}{(x_1 - x_2)(y_2^2 - y_3^2) - (x_2 - x_3)(y_1^2 - y_2^2)} \\ a^2 = (x_1 - c)^2 + \dfrac{2c(x_3 - x_1) - (x_3^2 - x_1^2)}{(y_3^2 - y_1^2)} y_1^2 \\ b^2 = \dfrac{(x_1 - c)^2 (y_3^2 - y_1^2)}{2c(x_3 - x_1) - (x_3^2 - x_1^2)} + y_1^2 \end{cases} \quad (4)$$

Accordingly, the output voltage estimation value $$v_{oEst} = \frac{v_{in} - c}{n}$$

may be estimated according to c, and a resonant impedance estimation value $$Z_{rEst} = \sqrt{\frac{L_r}{C_r}} = \frac{a}{b}$$

of the resonant converter may be estimated according to $a^2$ and $b^2$.

Figure 5:
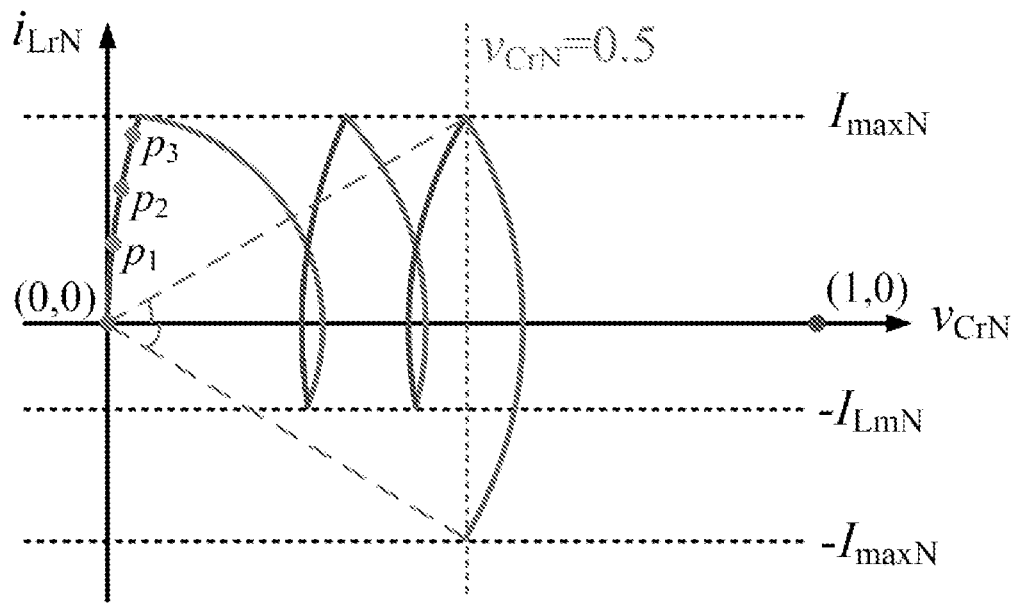
FIG. 5 is a schematic diagram of a state trajectory of the equivalent resonant capacitor voltage $v_{Cr}$ and the equivalent resonant inductor current $i_{Lr}$ when the resonant converter starts according to the disclosure.

Moreover, when the resonant converter starts, the state trajectory (as shown in FIG. 5) of the resonant capacitor voltage $v_{Cr}$ and the resonant current $i_{Lr}$ also satisfy the elliptic equation, and the corresponding parameters also may be estimated using the method above for estimating parameters.

Figure 6A:
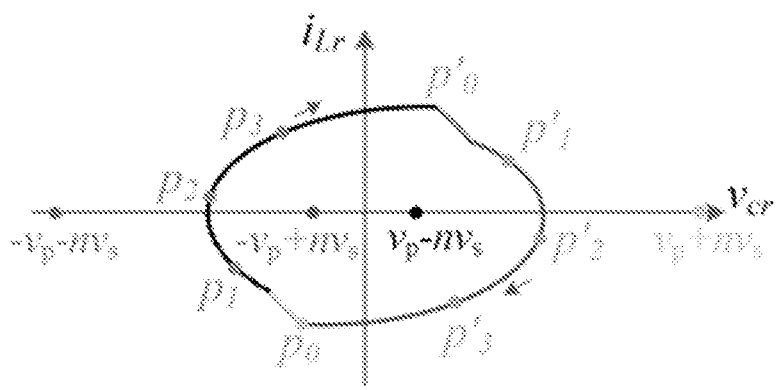
FIGS. 6A and 6B are schematic diagrams of state trajectories sampled by the resonant tank under different sampling rates.
Figure 6B:
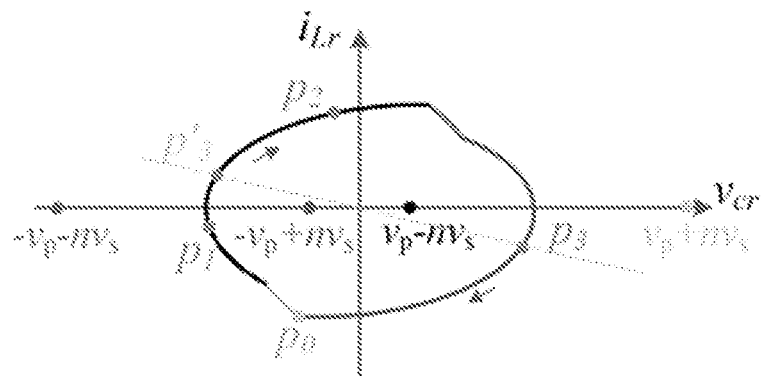

(2) when distribution of the sampling points is different,

Taking the switching frequency $f_s$>the resonant frequency $f_r$ shown in FIGS. 6A to 6B for example, explanation is made, wherein at least three effective sampling points are sampled. Similarly, when $f_s = f_r$, and $f_s < f_r$, so the details are not described here.

When distribution of the sampling points is different, sampling may be performed in the same switching period, including but not limited to continuous sampling only in the positive half period or only in the negative half period.

When the sampling rate is sufficient high, the at least three effective sampling points may be continuously sampled only in the positive half period or only in the negative half period of the same switching period. As shown in FIG. 6A, when sampling only in the positive half period (i.e., the effective sampling points are only in the positive half period), an interval time $T_d$ is sequentially delayed for sampling starting from a rising edge of the primary bridge arm voltage $v_p$ (corresponding to the sampling point $p_0$) or slightly lagged, and the interval time $T_d$ delayed each time may be the same, and also may be different, such as, sampling at the sampling points $p_1$, $p_2$ and $p_3$. As shown in FIG. 6A, when sampling only in the negative half period (i.e., the effective sampling points are only in the negative half period), an interval time $T_d$ is sequentially delayed for sampling starting from a falling edge of the primary bridge arm voltage $v_p$ (corresponding to the sampling point $p'_0$) or slightly lagged, and the interval time $T_d$ delayed each time may be the same, and also may be different, such as, sampling at the sampling points $p'_1$, $p'_2$ and $p'_3$.

Alternatively, the effective sampling points also may be in the positive half period and the negative half period. For example, the at least three effective sampling points may be continuously sampled in the positive half period and the negative half period of the same switching period, including but not limited to the case shown in FIG. 6B, i.e., sampling at the sampling points $p_1$ and $p_2$ in the positive half period, and sampling at the sampling point $p_3$ in the negative half period. As for the case shown in FIG. 6B, when estimating, the effective sampling points in the negative half period may be converted to the positive half period for estimating the parameters using central symmetry of the sampling points in the positive and negative half periods, for example, the sampling point $p_3$ in FIG. 6B is converted to the sampling point $p'_3$. In other embodiments, the effective sampling points in the positive half period also may be converted to the negative half period for estimating the parameters, but the disclosure is not limited thereto.

When distribution of the sampling points is different, sampling also may be performed in a plurality of different switching periods. That is, sampling may be performed in the plurality of different switching periods (the plurality of different switching periods can be continuous, and also may be non-continuous), and when estimating the parameters, at least three effective sampling points may be ensured.

(II) The Method for Estimating Parameters of the Resonant Tank (the Equivalent Resonant Inductor $L_r$, the Equivalent Resonant Capacitor $C_r$ and the Magnetic Inductor $L_m$) and a Resonant Current Average Value $i_{LrAvg}$ in a Half Switching Period (1) Estimating the equivalent resonant inductor $L_r$ and the equivalent resonant capacitor $C_r$ In the disclosure, when an equivalent resonant capacitor estimation value $C_{rEst}$ and/or an equivalent resonant inductor estimation value $L_{rEst}$ are estimated, firstly, the state trajectory is normalized to obtain a normalized trajectory, and a resonant angular frequency estimation value $\omega_{rEst}$ of the resonant converter is estimated according to the normalized trajectory. Then, the equivalent resonant capacitor estimation value $C_{rEst}$ and/or the equivalent resonant inductor estimation value $L_{rEst}$ may be estimated according to the resonant impedance estimation value $Z_{rEst}$ and the resonant angular frequency estimation value $\omega_{rEst}$.

Figure 7A:
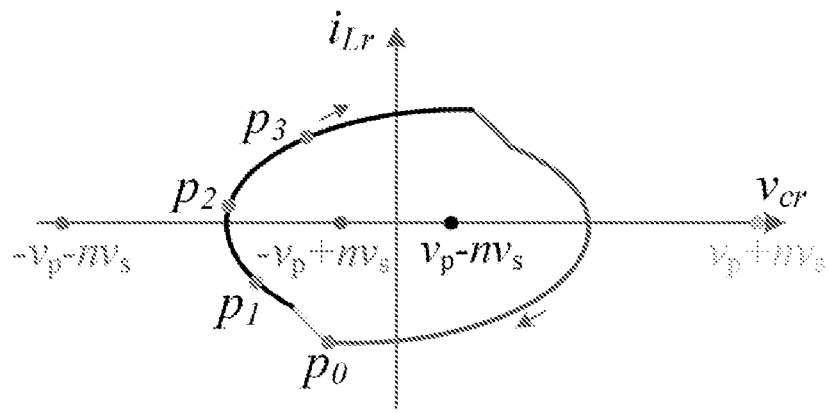
FIG. 7A illustrates an elliptical trajectory formed by the equivalent resonant capacitor voltage $v_{Cr}$ and the equivalent resonant inductor current $i_{Lr}$ when the switching frequency $f_s$>the resonant frequency $f_r$.
Figure 7B:
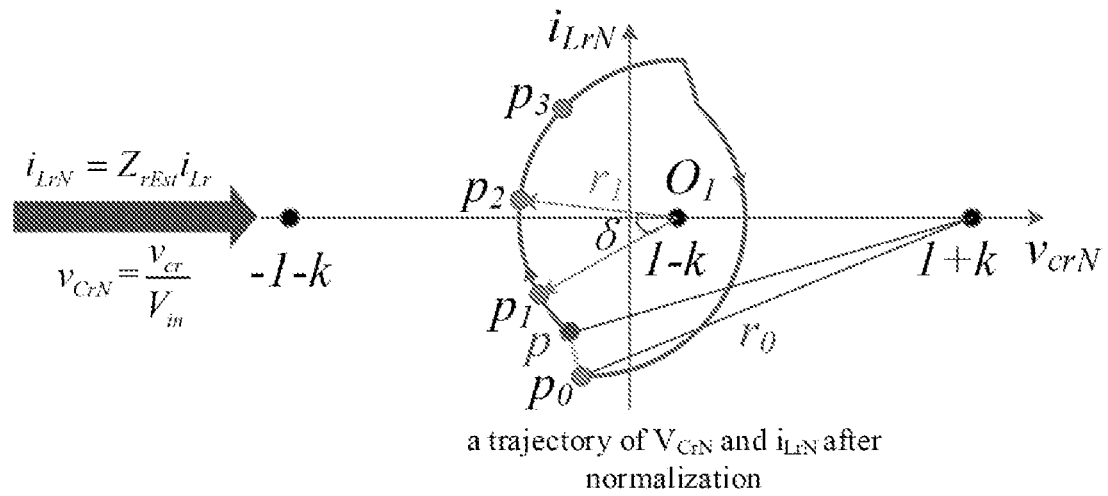
FIG. 7B illustrates a trajectory after the elliptical trajectory of FIG. 7A is normalized.

As shown in FIGS. 7A and 7B, they illustrate an elliptical trajectory formed by the equivalent resonant capacitor voltage $v_{Cr}$ and the equivalent resonant inductor current $i_{Lr}$, and an trajectory after normalization of the elliptical trajectory when the switching frequency $f_s >$ the resonant frequency $f_r$ (e.g., after normalization, it is a circular trajectory, but the disclosure is not limited thereto, similarly, when the switching frequency $f_s =$ the resonant frequency $f_r$, and the switching frequency $f_s <$ the resonant frequency $f_r$). In the normalized trajectory shown in FIG. 7B, as for an arc from $p_0$ to p, a center of circle is $(1+k, 0)$, and a radius is $r_0$. As for an arc from p to $p_3$, a center of circle is $(1-k, 0)$, and a radius is $r_1$. With respect to a triangle consisting of the sampling points $p_1$, $p_2$ and a center of circle $O_1$, it may be obtained $$\delta = 2 \arcsin \frac{\|p_2 - p_1\|}{2r_1},$$

so the resonant angular frequency estimation value may be approximately $$\omega_{rEst} = \frac{\delta}{T_d}.$$

According to $Z_{rEst}$ and $\omega_{rEst}$, the equivalent resonant capacitor estimation value $C_{rEst}$ and/or the equivalent resonant inductor estimation value $L_{rEst}$ may be estimated:

$$\begin{cases} C_{rEst} = \dfrac{1}{Z_{rEst}\omega_{rEst}} \\ L_{rEst} = \dfrac{Z_{rEst}}{\omega_{rEst}} \end{cases} \quad (5)$$

As can be known, the output voltage estimation value $v_{oEst}$, the equivalent resonant capacitor estimation value $C_{rEst}$ and the equivalent resonant inductor estimation value $L_{rEst}$ may be estimated using three effective sampling points.

(2) Estimating the Magnetic Inductor $L_m$

When the three effective sampling points include the sampling point $p_0$ (referring to FIG. 6A, the sampling point at a moment corresponding to a rising edge of the primary bridge arm voltage $v_p$) or the sampling point $p'_0$ (referring to FIG. 6A, the sampling point at a moment corresponding to a falling edge of the primary bridge arm voltage $v_p$), the magnetic inductor $L_m$ may be directly estimated.

When the three effective sampling points does not include the sampling point $p_0$ or the sampling point $p'_0$, sampling corresponding to the sampling point $p_0$ or the sampling point $p'_0$ shall be added, and estimation is made using the sampling values of the resonant capacitor voltage and the resonant current corresponding to the sampling point $p_0$ or the sampling point $p'_0$ to obtain the output voltage estimation value $v_{oEst}$ (i.e., the second voltage estimation value). Then, a magnetic inductor estimation value $L_{mEst}$ of the resonant converter may be estimated according to the output voltage estimation value $v_{oEst}$ and a per-unit value $i_{LmpkEst}$ of a current peak of the magnetic inductor.

For example, in FIG. 7B, a crossing point $p(\xi, \eta)$ of an arc $\widehat{p_0 p}$ and an arc $\widehat{pp_1}$ satisfies $$\begin{cases} (\xi - (1+k))^2 + \eta^2 = r_0^2 \\ (\xi - (1-k))^2 + \eta^2 = r_1^2 \end{cases},$$

and vertical coordinates of the crossing point p is a per-unit value of the current peak of the magnetic inductor, i.e., $$\eta = i_{LmpkEstN} = \sqrt{r_0^2 - \left(\frac{r_1^2 - r_0^2}{4k} - k\right)^2}, \text{ so,}$$

$$L_{mEst} = \frac{nv_{oEst}T_h}{2i_{LmpkEst}} \quad (6)$$

The method for estimating parameters in the disclosure may estimate the output voltage estimation value $v_{oEst}$, the equivalent resonant capacitor estimation value $C_{rEst}$, the equivalent resonant inductor estimation value $L_{rEst}$, and the magnetic inductor estimation value $L_{mEst}$ using the elliptical trajectory in time domain without knowing resonant parameters in advance, and may estimate the parameters online.

Figure 8:
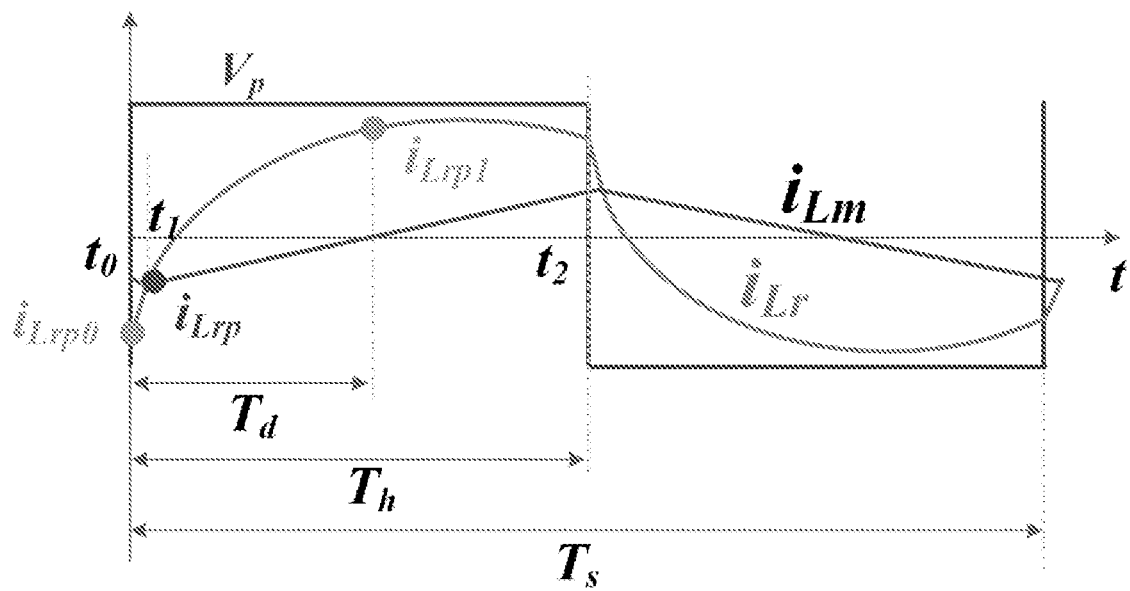
FIG. 8 illustrates a waveform of the resonant tank when the switching frequency $f_s$>the resonant frequency $f_r$.

(3) Estimating the Resonant Current Average Value $i_{LrAvg}$ in the Half Switching Period When the switching frequency $f_s >$ the resonant frequency $f_r$, a waveform of the resonant tank is shown in FIG. 8, wherein a sampling value of the corresponding resonant current at a time $t_0$ is $i_{Lr1}$ (i.e., corresponding to a resonant current $i_{Lrp0}$ at the sampling point $p_0$), and after an interval time $T_d$, a sampling value of the resonant current is $i_{Lr2}$ (i.e., corresponding to a resonant current $i_{Lrp1}$ at the sampling point $p_1$).

Assuming that the resonant current is approximately to be a sine wave, i.e., $i_{Lr}=A \sin(\theta_r t+\varphi)$, a waveform of a fundamental wave of the resonant current $i_{Lr}$ may be estimated approximately according to the sampling value $i_{Lr1}$ at the sampling point $p_0$ and the sampling value $i_{Lr2}$ at the sampling point $p_1$:

$$\begin{cases} A \sin\varphi = i_{Lr1} \\ A \cos\varphi = \dfrac{i_{Lr2} - i_{Lr1}\cos(\omega_r T_d)}{\sin(\omega_r T_d)} \end{cases} \quad (7)$$

Therefore, the estimation value $i_{LrAvgEst}$ of the resonant current average value in the half switching period $T_h$ is:

$$i_{LrAvgEst} = \frac{1}{T_h}\int_0^{T_h} A\sin(\omega_r t+\varphi)dt = \quad (8)$$

$$\frac{2\sin\left(\dfrac{\omega_r T_h}{2}\right)}{\omega_r T_h}\left[\cos\left(\dfrac{\omega_r T_h}{2}\right)i_{Lr1} + \dfrac{i_{Lr2}-i_{Lr1}\cos(\omega_r T_d)}{\sin(\omega_r T_d)}\sin\left(\dfrac{\omega_r T_h}{2}\right)\right]$$

where $T_h = \dfrac{1}{2f_s}$.

In the disclosure, double closed-loop control of $v_o$ outer loop-$i_{Lr}$ inner loop of the resonant converter may be achieved according to the estimated output voltage $v_o$ and the resonant current $i_{Lr}$. For example, control of the current inner loop may be satisfied through approximation of the fundamental wave of the resonant current $i_{Lr}$. Moreover, when the output voltage is sampled, the outer loop may use a sampling value of the output voltage as a feedback, and when the output voltage cannot be acquired, the output voltage estimation value $v_{oEst}$ may be used as a feedback, thereby achieving the function of double closed-loop control.

As shown in FIG. 9, the disclosure further provides a method 900 for controlling a resonant converter, including:

step S901, configuring a double closed-loop controller 30 (referring to FIG. 1) having a voltage feedback terminal 301 on an outer loop and configured to receive a voltage signal for reflecting an output voltage at an output port 102 of the resonant converter, and a current feedback terminal 302 on an inner loop and configured to receive an estimation value $i_{LrAvgEst}$ of a resonant current average value in a half switching period obtained by estimation using the method for estimating parameters, wherein a voltage value of the voltage signal is an output voltage sampling value $v_o$ sampled from the output port, or a second voltage estimation value $v_{oEst}$ obtained by estimation using the method for estimating parameters as an output voltage estimation value $v_{oEst}$;

step S902, when the output voltage sampling value $v_o$ can be sampled, the double closed-loop controller 30 receives the output voltage sampling value $v_o$ through the voltage feedback terminal 301, and controls a primary switching frequency of primary switches in a primary circuit OSC of the resonant converter; and step S903, when the output voltage sampling value $v_o$ cannot be sampled, the double closed-loop controller 30 receives the output voltage estimation value $v_{oEst}$ through the voltage feedback terminal 301, and controls the primary switching frequency of the primary switches.

Figure 9B:
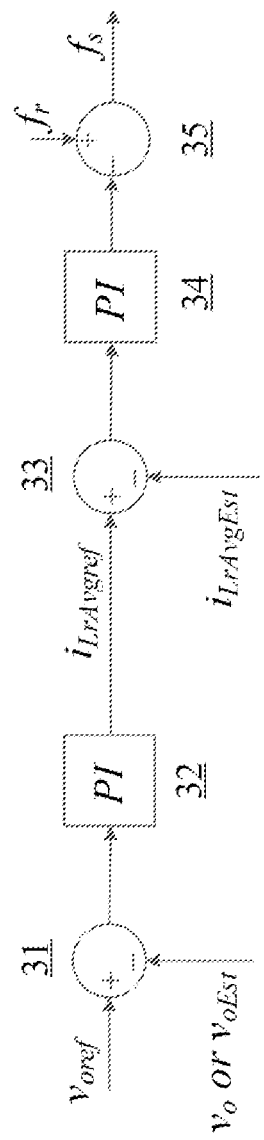
FIG. 9B is a block diagram of a double closed-loop controller of the resonant converter according to the disclosure.
Figure 10:
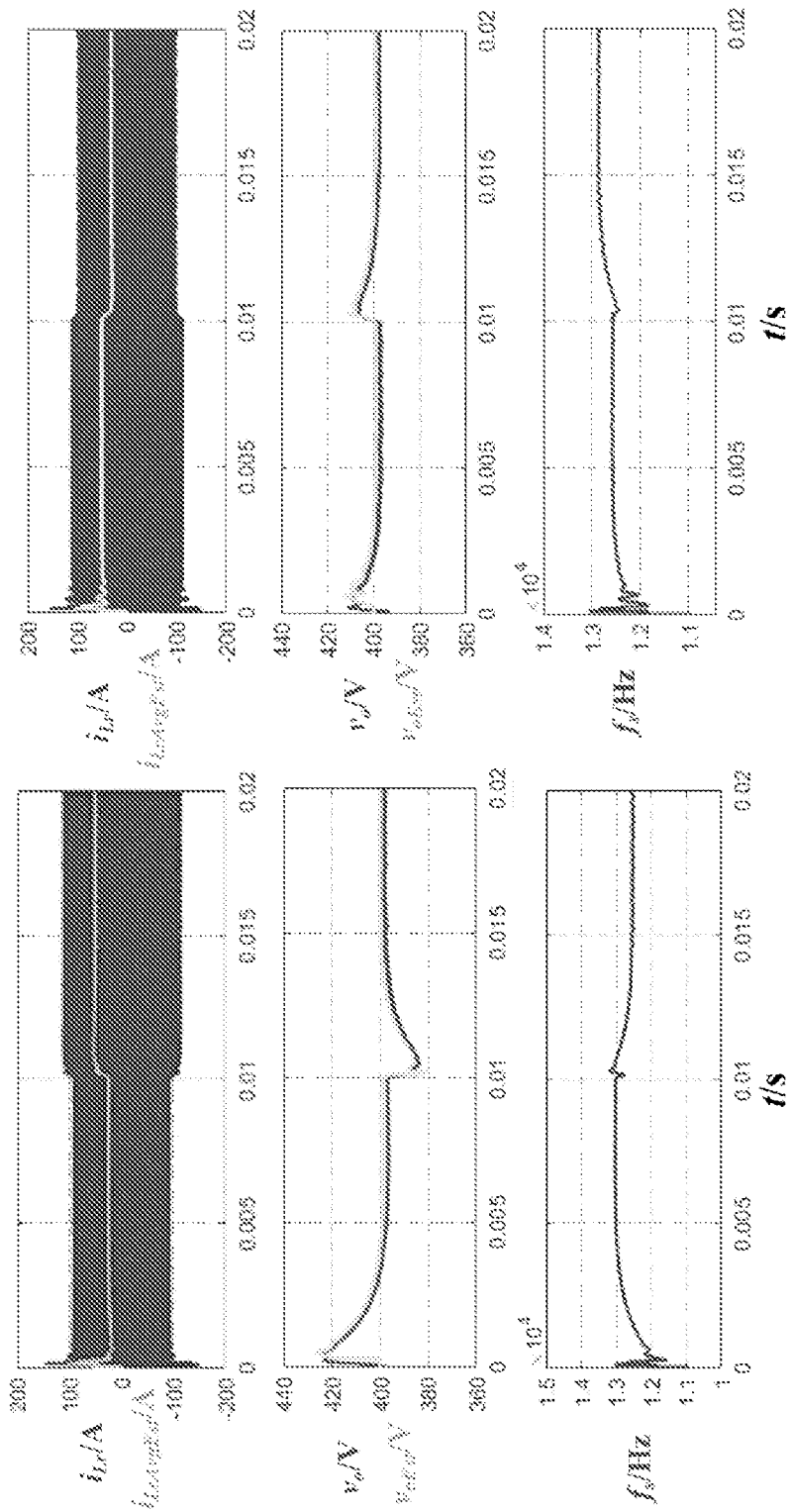
FIG. 10 illustrates control effect when load increasing or load decreasing using the control block diagram of FIG. 1.

In the disclosure, when the primary and secondary sides do not communicate, the primary switches may be controlled using the control block diagram shown in FIG. 9B. Moreover, control effect when load increasing or load decreasing is shown in FIG. 10, wherein a portion a in FIG. 10 illustrates control effect when suddenly load increasing from 40A to 80A, and a portion b in FIG. 10 illustrates control effect when suddenly load decreasing from 80A to 50A. As shown in FIG. 10, the control method provided in the disclosure is stable in a dynamic state of suddenly load increasing and load decreasing, and the output voltage estimation value $v_{oEst}$ is substantially consistent with the actual value, thereby verifying feasibility using a fitting algorithm of the elliptical trajectory in the disclosure.

Figure 11:
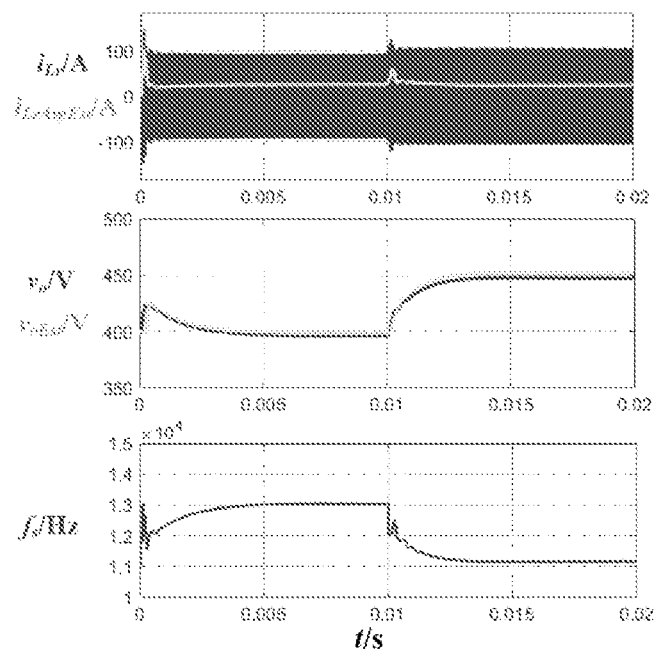
FIG. 11 illustrates control effect when there is no communication between the primary and secondary sides, and an output voltage reference value rises.
Figure 12:
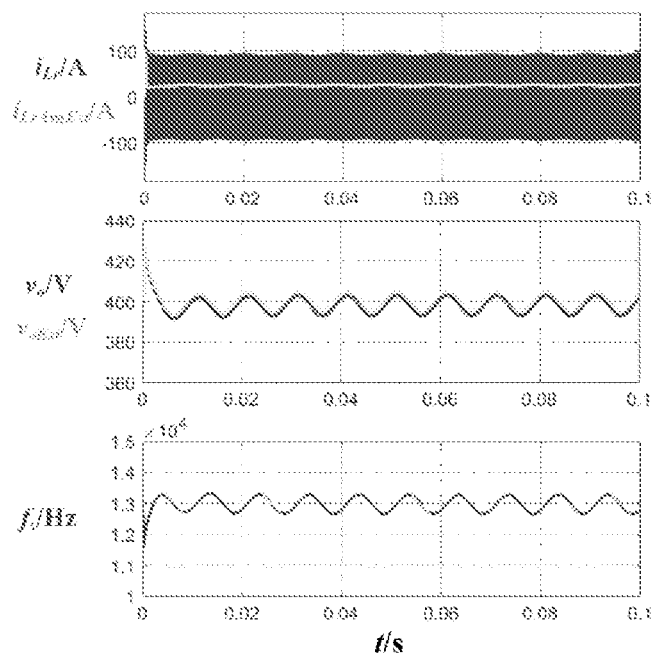
FIG. 12 illustrates control effect when there is no communication between the primary and secondary sides, and an input voltage includes double-frequency fluctuation.

In the disclosure, when the primary and secondary sides do not communicate, control effect when the output voltage reference value $v_{oref}$ changes is shown in FIG. 11, and control effect when the input voltage includes double-frequency fluctuation is shown in FIG. 12. As can be known from FIGS. 11 and 12, the control method provided in the disclosure is suitable for the step of output voltage given value and fluctuation of the input voltage.

Figure 13:
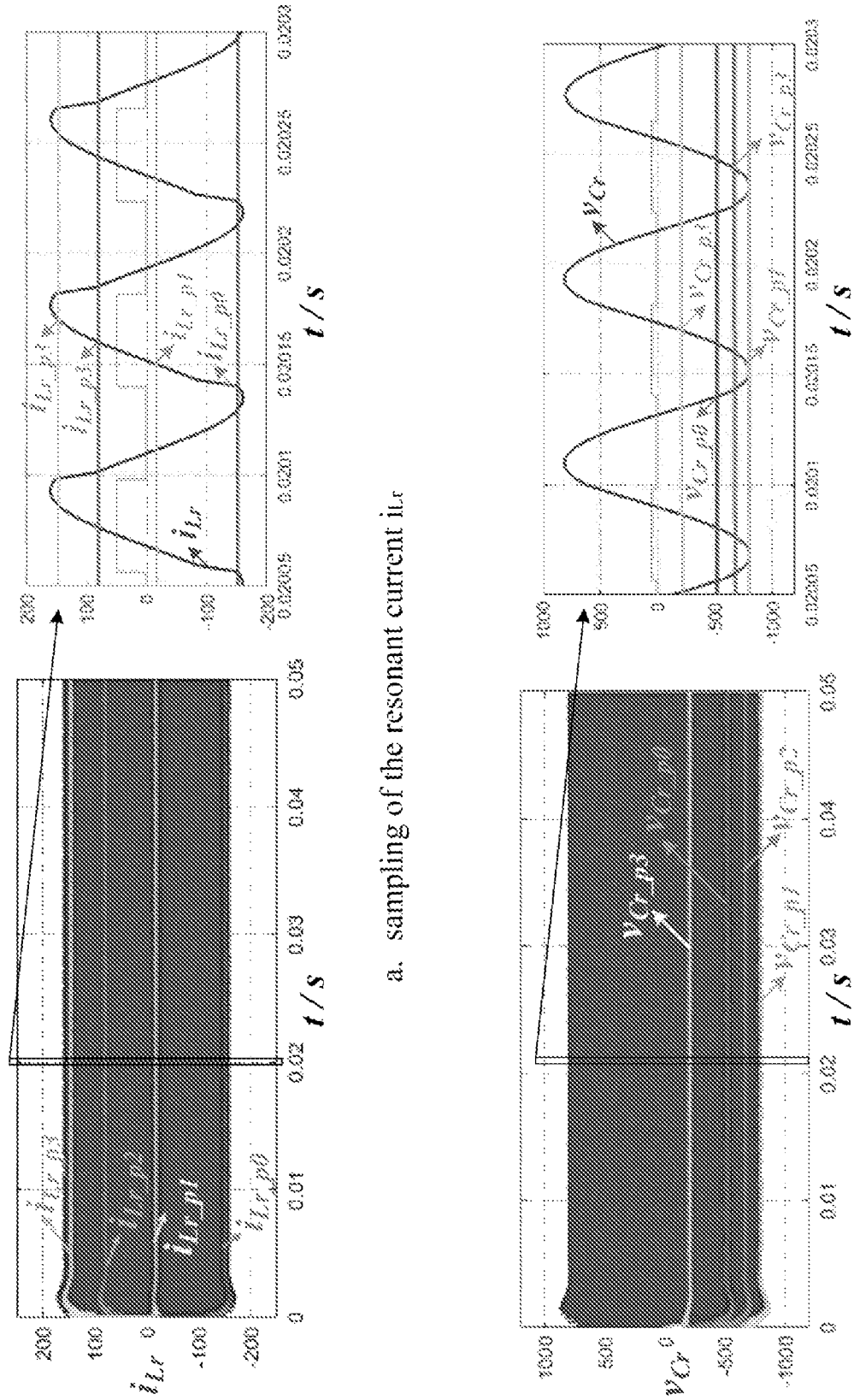
FIG. 13 illustrates sampling effect of the equivalent resonant capacitor voltage $v_{Cr}$ and the equivalent resonant inductor current $i_{Lr}$ of the disclosure when parameters of the resonant tank are consistent with a design value.

In the disclosure, when parameters of the resonant tank are consistent with a design value, sampling effects of the resonant capacitor voltage $v_{Cr}$ and the resonant current $i_{Lr}$ provided in the disclosure are shown by the portions b and a in FIG. 13, and control effect is shown in FIG. 14. Simulation takes four sampling points sampled in the positive half period for example. As can be known from the control effect, the estimation value $i_{LrAvgEst}$ of the resonant current average value in the half switching period and the output voltage estimation value $v_{oEst}$ are substantially consistent with the actual values, and an error of parameter estimation of the resonant tank is less than 1.2%. Simulation shows feasibility of sampling of the resonant tank and the method for estimating parameters provided in the disclosure.

Figure 15:
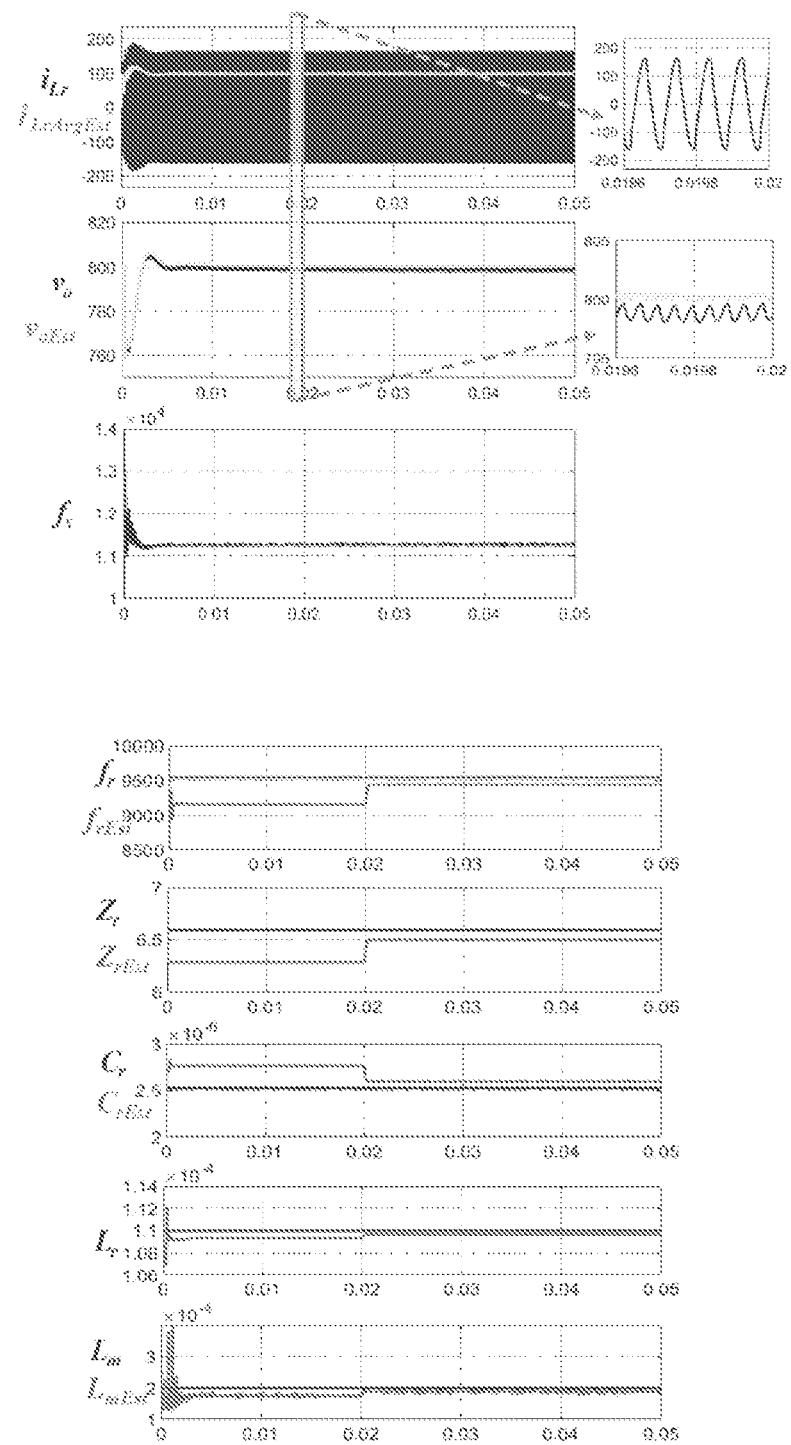
FIG. 15 illustrates control effect of the disclosure when the actual $L_r$ is larger than 10%, and other parameters are constant.

In the disclosure, when the actual $L_r$ is larger than 10%, and other parameters are constant, control effect of the control method provided in the disclosure is shown in FIG. 15. As can be seen from FIG. 15, before 0.02 s, estimation of the parameters of the resonant tank is not started, and only the output voltage and the resonant current are estimated. Since estimation of the output voltage estimation value $v_{oEst}$ and the estimation value $i_{LrAvgEst}$ of the resonant current average value in the half switching period is not dependent on parameters of the resonant tank, the estimation values vary along with actual parameters. However, estimation of the resonant capacitor estimation value $C_{rEst}$, the resonant inductor estimation value $L_{rEst}$ and the magnetic inductor estimation value $L_{mEst}$ is dependent on normalization of the resonant impedance, and when the resonant inductor $L_r$ is inconsistent with the design value, parameter calculation and the actual value have a large error. After estimation of the parameters of the resonant tank is started at 0.02 s, an estimation result of the resonant impedance estimation value $Z_{rEst}$ is approximate to the actual value, and an estimation value of the parameters of the resonant tank is more approximate to the actual value.

The method for estimating parameters of the LLC resonant converter provided in the disclosure may be applied to scenarios such as quick charging station, photovoltaic power station, data center, energy storage and microgrid in the SST. The embodiment of the disclosure is not limited to estimation of the parameters of the resonant tank of the LLC resonant converter, and the disclosure is also not limited to the following listed examples.

Figure 16:
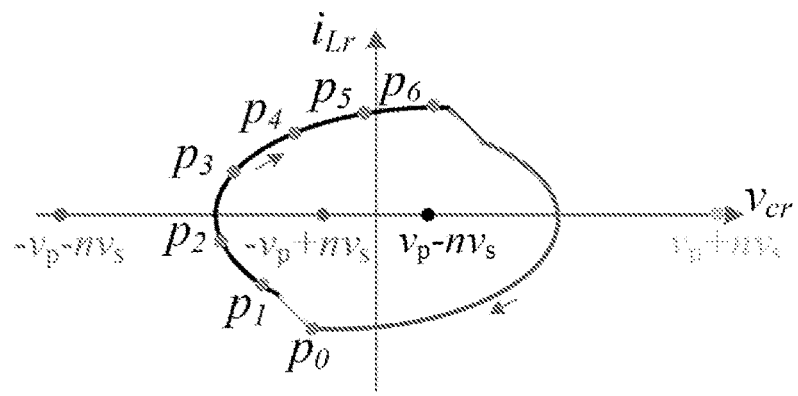
FIG. 16 is a schematic diagram of a state trajectory of the equivalent resonant capacitor voltage $v_{Cr}$ and the equivalent resonant inductor current $i_{Lr}$ obtained by seven sampling points sampled in a half switching period when the switching frequency $f_s$>the resonant frequency $f_r$.

Example I. Estimation of Parameters when the Sampling Points are Greater than Four As shown in FIG. 16, it illustrates a trajectory formed by the equivalent resonant capacitor voltage $v_{Cr}$ and the equivalent resonant inductor current $i_{Lr}$ when the switching frequency $f_s$>the resonant frequency $f_r$. When the sampling rate satisfies the requirement, sampling may be performed as many as possible to improve accuracy of parameter estimation. FIG. 16 gives a schematic diagram of seven sampling points sampled in the half switching period, i.e., the sampling point is $p_i(x_i, y_i)$, where i=0 to 6, and the sampling points $p_1$ to $p_6$ fall into the second elliptic arc. Data of the six sampling points $p_1$ to $p_6$ are placed into the elliptic equation to obtain an overdetermined equation set consisting of three unknown numbers a, b and c, and six equations:

$$\begin{cases} \frac{(x_1-c)^2}{a^2} + \frac{y_1^2}{b^2} = 1 \\ \frac{(x_2-c)^2}{a^2} + \frac{y_2^2}{b^2} = 1 \\ \frac{(x_3-c)^2}{a^2} + \frac{y_3^2}{b^2} = 1 \\ \frac{(x_4-c)^2}{a^2} + \frac{y_4^2}{b^2} = 1 \\ \frac{(x_5-c)^2}{a^2} + \frac{y_5^2}{b^2} = 1 \\ \frac{(x_6-c)^2}{a^2} + \frac{y_6^2}{b^2} = 1 \end{cases} \quad (9)$$

After every two equations in the formula (9) are subtracted, and both sides of the equation are multiplied by b2, it is obtained:

$$\begin{cases} \frac{(x_1-c)^2 - (x_2-c)^2}{a^2/b^2} + y_1^2 - y_2^2 = 0 \\ \frac{(x_2-c)^2 - (x_3-c)^2}{a^2/b^2} + y_2^2 - y_3^2 = 0 \\ \frac{(x_3-c)^2 - (x_4-c)^2}{a^2/b^2} + y_3^2 - y_4^2 = 0 \\ \frac{(x_4-c)^2 - (x_5-c)^2}{a^2/b^2} + y_4^2 - y_5^2 = 0 \\ \frac{(x_5-c)^2 - (x_6-c)^2}{a^2/b^2} + y_5^2 - y_6^2 = 0 \\ \frac{(x_6-c)^2 - (x_1-c)^2}{a^2/b^2} + y_6^2 - y_1^2 = 0 \end{cases} \quad (10)$$

The formula (10) may be modified to $A_{m \times 2} z = B$, where $$z = \begin{bmatrix} \frac{a^2}{b^2} & c \end{bmatrix}^T,$$

and m is the number of sampling points on the elliptic arc. In this example, m=6. The least square solution $z = (A^T \cdot A)^{-1} A^T B$ may be obtained, thereby estimating the output voltage estimation value $$v_{oEst} = \frac{V_{in} - c}{n}$$

and the resonant impedance estimation value $$Z_{rEst} = \sqrt{\frac{L_r}{C_r}} = \frac{a}{b}.$$

Figure 17:
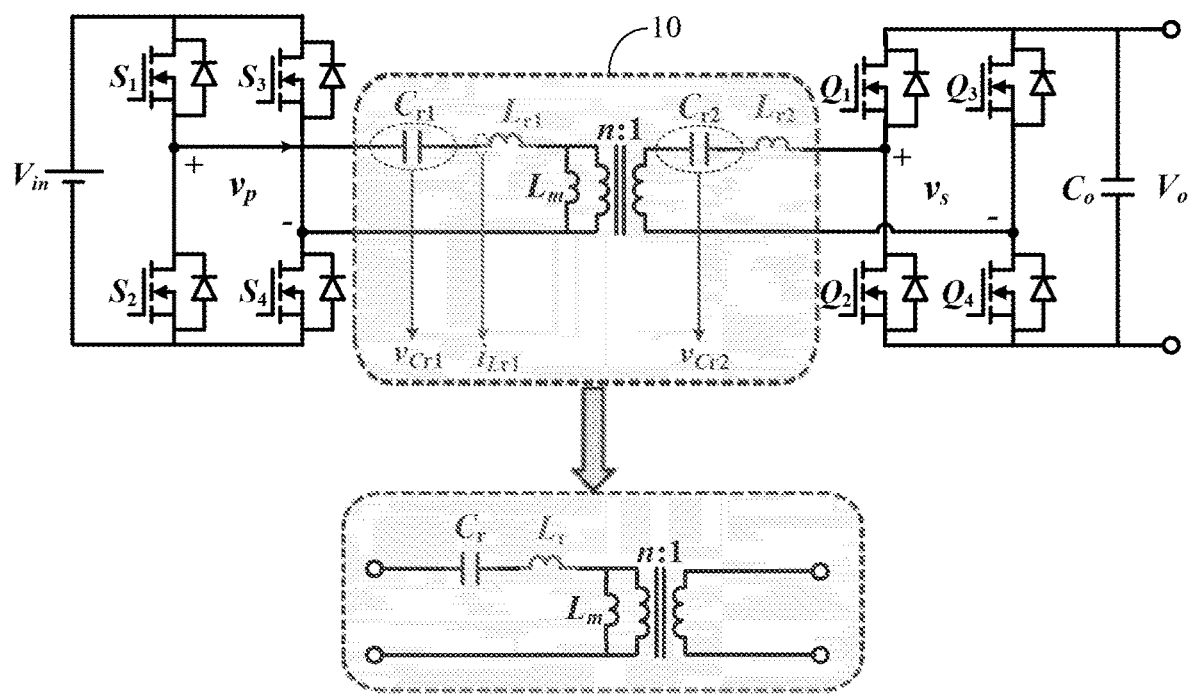
FIG. 17 is an equivalent diagram of a topology and a resonant tank of a CLLC resonant converter according to the disclosure.

Example II: Estimation of Equivalent Parameters of the CLLC Resonant Converter FIG. 17 is an equivalent diagram of a circuit topology and a resonant tank of the CLLC resonant converter, where $C_{r1}$ and $C_{r2}$ are a primary resonant capacitor and a secondary resonant capacitor, respectively, $L_{r1}$ and $L_{r2}$ are a primary resonant inductor and a secondary resonant inductor, respectively, $C_r$ is an equivalent resonant capacitor, $L_r$ is an equivalent resonant inductor, and n is a transformer ratio.

According to an impedance equivalent relation of primary and secondary sides of the transformer, $L_r = L_{r1} + n^2 L_{r2}$ and $$C_r = \frac{n^2 C_{r1} C_{r2}}{n^2 C_{r2} + C_{r1}}$$

may be obtained, the equivalent resonant capacitor voltage is $v_{Cr} = v_{Cr1} + n V_{Cr2}$ by sampling a primary resonant capacitor voltage $v_{Cr1}$, a secondary resonant capacitor voltage $v_{Cr2}$, and a primary resonant current $i_{Lr1}$, and the parameters may be estimated using the method for estimating parameters provided in the disclosure according to $v_{Cr}$ and $i_{Lr1}$.

The disclosure provides a method for estimating parameters of a resonant converter, and the parameters such as $C_r$, $L_r$, $L_m$, $V_o$ and $i_{LrAvg}$ may be estimated by sampling the resonant capacitor voltage and the resonant inductor current using the elliptical trajectory in time domain.

The disclosure may further design the double closed-loop controller of $v_{oEst}$ outer loop-$i_{LrAvgEst}$ inner loop according to the output voltage estimation value $v_{oEst}$ and the estimation value $i_{LrAvgEst}$ of the resonant current average value in the half switching period, achieves stable control of the output voltage, and is suitable for non-communication control between the primary and secondary sides of the resonant converter.

Exemplary embodiments of the disclosure are illustrated and described in details. It shall be understood that the disclosure is not limited to the disclosed embodiments, and in contrast, the disclosure aims to cover various modifications and equivalent arrangements included in spirit and scope of the appended claims.

What is claimed is:

1. A method for estimating parameters of a resonant converter, wherein the resonant converter comprises a first port, a second port, and a resonant tank that includes an equivalent resonant capacitor and an equivalent resonant inductor, the method comprising:
   estimating a second voltage estimation value of the second port, an equivalent resonant capacitor estimation value, and/or an equivalent resonant inductor estimation value of the resonant converter according to a first voltage of the first port, an equivalent resonant capacitor voltage and an equivalent resonant inductor current of at least three effective points, wherein the at least three effective points have different coordinates on a state plane of the equivalent resonant capacitor voltage and the equivalent resonant inductor current, and are on a state trajectory formed by the equivalent resonant capacitor voltage and the equivalent resonant inductor current, and the at least three effective points are not central symmetric about a center of the state trajectory.

2. The method for estimating parameters according to claim 1, wherein estimating the second voltage estimation value comprises:
constructing an energy function of the resonant tank, and obtaining a trajectory equation of the state trajectory of the resonant capacitor voltage and the resonant inductor current on the state plane according to a state equation of the resonant capacitor voltage and the resonant inductor current in time domain when the resonant converter works or starts; and
estimating the second voltage estimation value according to the trajectory equation and the at least three effective points.

3. The method for estimating parameters according to claim 2, further comprising:
estimating a resonant impedance estimation value of the resonant converter according to the trajectory equation.

4. The method for estimating parameters according to claim 2, wherein the at least three effective points may be obtained by sampling, i.e., sampling the resonant capacitor voltage and the resonant inductor current of at least three effective sampling points, the effective sampling points are defined in all sampling points, and every two sampling points cannot have an interval of $$\frac{m-1}{2}T_s,$$

where m is a positive integer, and $T_s$ is a switching period of the resonant converter;
the resonant capacitor voltage and the resonant inductor current are synchronously sampled at each of the effective sampling points correspondingly.

5. The method for estimating parameters according to claim 4, wherein the at least three effective sampling points are sampled in a positive half period or a negative half period of the same switching period.

6. The method for estimating parameters according to claim 5, wherein,
when the at least three sampling points are sampled in the positive half period, a first interval time is sequentially delayed to synchronously sample the resonant capacitor voltage and the resonant inductor current starting from a rising edge of a primary bridge arm voltage of the resonant converter or lagging a first lag time, wherein the first interval time delayed each time is the same or different;
when the at least three sampling points are sampled in the negative half period, a second interval time is sequentially delayed to synchronously sample the resonant capacitor voltage and the resonant inductor current starting from a falling edge of the primary bridge arm voltage of the resonant converter or lagging a second lag time, wherein the second interval time delayed each time is the same or different.

7. The method for estimating parameters according to claim 4, wherein the at least three effective sampling points are sampled in a positive half period and a negative half period of the same switching period.

8. The method for estimating parameters according to claim 7, wherein when estimating, the effective sampling points in the negative half period are converted to the positive half period for estimation, or the effective sampling points in the positive half period are converted to the negative half period for estimation using central symmetry of the sampling points in the positive half period and the negative half period.

9. The method for estimating parameters according to claim 4, wherein the at least three effective sampling points are sampled in a plurality of different switching periods, and the plurality of switching periods are continuous or non-continuous.

10. The method for estimating parameters according to claim 3, wherein estimating the equivalent resonant capacitor estimation value, and/or the equivalent resonant inductor estimation value comprises:
normalizing the state trajectory to obtain a normalized trajectory, and estimating a resonant angular frequency estimation value of the resonant converter according to the normalized trajectory; and
estimating the equivalent resonant capacitor estimation value, and/or the equivalent resonant inductor estimation value according to the resonant impedance estimation value and the resonant angular frequency estimation value.

11. The method for estimating parameters according to claim 4, wherein the resonant tank further includes a magnetic inductor, and the method for estimating parameters further comprises:
estimating a magnetic inductor estimation value of the resonant converter according to the second voltage estimation value obtained by estimation and a per-unit value of a current peak of the magnetic inductor when the at least three effective points include a sampling point $P_0$ at a moment corresponding to a rising edge or a falling edge of a primary bridge arm voltage of the resonant converter.

12. The method for estimating parameters according to claim 4, wherein the resonant tank further includes a magnetic inductor, and the method for estimating parameters further comprises:
when the at least three effective points do not include a sampling point $P_0$ at a moment corresponding to a rising edge or a falling edge of a primary bridge arm voltage of the resonant converter, increasing sampling corresponding to the sampling point $P_0$ estimating the sampling value of the resonant capacitor voltage and the resonant inductor current of the sampling point $P_0$ to obtain the second voltage estimation value, and estimating a magnetic inductor estimation value of the resonant converter according to the second voltage estimation value and a per-unit value of a current peak of the magnetic inductor.

13. The method for estimating parameters according to claim 1, further comprising:
estimating an estimation value of a resonant inductor current average value in a half switching period according to the corresponding resonant inductor current values at the two effective points in the at least three effective points.

14. The method for estimating parameters according to claim 1, wherein when the effective points more than three, the second voltage estimation value of the second port, the equivalent resonant capacitor estimation value, and/or the equivalent resonant inductor estimation value of the resonant converter are estimated using least square fitting.

15. The method for estimating parameters according to claim 1, wherein the resonant converter is a LLC resonant converter.

16. The method for estimating parameters according to claim 1, wherein the resonant converter is a CLLC resonant converter, by sampling a primary resonant capacitor voltage, a secondary resonant capacitor voltage and a primary resonant current of the CLLC resonant converter, an equivalent value of the equivalent resonant capacitor voltage is calculated according to sampling values of the primary resonant capacitor voltage and the secondary resonant capacitor voltage to estimate using the equivalent value of the equivalent resonant capacitor voltage and the sampling value of the primary resonant current.

17. A method for controlling a resonant converter, comprising:
    configuring a double closed-loop controller having a voltage feedback terminal on an outer loop and configured to receive a voltage signal reflecting an output voltage at an output port of the resonant converter, and a current feedback terminal on an inner loop and configured to receive an estimation value of a resonant current average value in a half switching period obtained by estimation according to the method for estimating parameters of claim 13, wherein a voltage value of the voltage signal is an output voltage sampling value sampled from the output port, or the second voltage estimation value obtained by estimation according to the method for estimating parameters of claim 13 as an output voltage estimation value;
    when the output voltage sampling value can be sampled, the double closed-loop controller receives the output voltage sampling value through the voltage feedback terminal, and controls a primary switching frequency of primary switches in a primary circuit of the resonant converter;
    when the output voltage sampling value cannot be sampled, the double closed-loop controller receives the output voltage estimation value through the voltage feedback terminal, and controls the primary switching frequency of the primary switches.

18. The method for controlling a resonant converter according to claim 17, wherein,
    the primary circuit comprises a first primary bridge arm and a second primary bridge arm connected in parallel, the first primary bridge arm comprises a first primary switch and a second primary switch connected in series, and the second primary bridge arm comprises a third primary switch and a fourth primary switch connected in series;
    the double closed-loop controller controls the first primary switch and the fourth primary switch to be synchronous and controls the second primary switch and the third primary switch to be synchronous, the first primary switch and the second primary switch are turned on complementarily according to 50% of a duty cycle, and the third primary switch and the fourth primary switch are turned on complementarily according to 50% of a duty cycle.

19. A resonant converter having a first port, a second port, and a resonant tank, wherein the resonant tank includes an equivalent resonant capacitor and an equivalent resonant inductor, and the resonant converter further comprises:
    an estimation unit configured to perform the method for estimating parameters according to claim 1 to obtain a second voltage estimation value of the second port, an equivalent resonant capacitor estimation value, and/or an equivalent resonant inductor estimation value of the resonant converter.

20. The resonant converter according to claim 19, wherein the resonant tank further includes a magnetic inductor, and the estimation unit is further configured to obtain a magnetic inductor estimation value of the resonant converter according to the second voltage estimation value obtained by estimation and a per-unit value of a current peak of the magnetic inductor when the at least three effective points include a sampling point $P_0$ at a moment corresponding to a rising edge or a falling edge of a primary bridge arm voltage of the resonant converter.

21. The resonant converter according to claim 19, wherein the resonant tank further includes a magnetic inductor, and the estimation unit is further configured to obtain a magnetic inductor estimation value of the resonant converter according to the second voltage estimation value and a per-unit value of a current peak of the magnetic inductor, wherein when the at least three effective points do not include a sampling point $P_0$ at a moment corresponding to a rising edge or a falling edge of a primary bridge arm voltage of the resonant converter, increasing sampling corresponding to the sampling point $P_0$, and estimating the sampling value of the resonant capacitor voltage and the resonant inductor current of the sampling point $P_0$ to obtain the second voltage estimation value.

22. The resonant converter according to claim 19, wherein the estimation unit is further configured to obtain an estimation value of a resonant current average value in a half switching period of the resonant converter according to the corresponding resonant inductor current values at the two effective points in the at least three effective points.

23. The resonant converter according to claim 22, wherein the first port is an input port of the resonant converter for receiving an input voltage, and the second port is an output port of the resonant converter for outputting an output voltage;
    the resonant converter further comprises:
    a double closed-loop controller having a voltage feedback terminal on an outer loop and configured to receive a voltage signal for reflecting the output voltage, and a current feedback terminal on an inner loop and configured to receive an estimation value of a resonant current average value in the half switching period, wherein a voltage value of the voltage signal is an output voltage sampling value sampled from the output port, or the second voltage estimation value as an output voltage estimation value;
    when the output voltage sampling value can be sampled, the double closed-loop controller receives the output voltage sampling value through the voltage feedback terminal, and controls primary switching frequencies of a plurality of primary switches in a primary circuit of the resonant converter;
    when the output voltage sampling value cannot be sampled, the double closed-loop controller receives the output voltage estimation value through the voltage feedback terminal, and controls the primary switching frequencies of the primary switches.

24. The resonant converter according to claim 23, wherein,
    the plurality of primary switches comprise a first controllable switching tube, a second controllable switching tube, a third controllable switching tube and a fourth controllable switching tube, the first controllable switching tube and the second controllable switching tube are connected in series to form a first primary bridge arm, the third controllable switching tube and the fourth controllable switching tube are connected in series to form a second primary bridge arm, the first primary bridge arm and the second primary bridge arm are connected in parallel, and a middle point of the first primary bridge arm and a middle point of the second primary bridge arm are connected to a first end of the resonant tank;

the double closed-loop controller controls the first controllable switching tube and the fourth controllable switching tube to be synchronous and controls the second controllable switching tube and the third controllable switching tube to be synchronous, the first controllable switching tube and the second controllable switching tube are turned on complementarily according to 50% of a duty cycle, and the third controllable switching tube and the fourth controllable switching tube are turned on complementarily according to 50% of a duty cycle.

25. The resonant converter according to claim 24, wherein a secondary circuit of the resonant converter comprises a first switching tube, a second switching tube, a third switching tube and a fourth switching tube, the first switching tube and the second switching tube are connected in series to form a first secondary bridge arm, the third switching tube and the fourth switching tube are connected in series to form a second secondary bridge arm, the first secondary bridge arm and the second secondary bridge arm are connected in parallel, and a middle point of the first secondary bridge arm and a middle point of the second secondary bridge arm are connected to a second end of the resonant tank.

26. The resonant converter according to claim 24, wherein the double closed-loop controller comprises a voltage comparison module, a first regulator, a current comparison module, a second regulator, a frequency comparison module, a limiter and a carrier generation module;

an output end of the voltage comparison module is connected to an input end of the current comparison module via the first regulator for comparing the voltage signal and an output voltage reference signal, outputting a reference signal of a resonant current average value in a half switching period after regulation of the first regulator, and transmitting to the current comparison module;

an output end of the current comparison module is connected to an input end of the frequency comparison module via the second regulator for comparing the reference signal of the resonant current average value in the half switching period and an estimation value of the resonant current average value in the half switching period, outputting a regulation signal after regulation of the second regulator, and transmitting to the frequency comparison module;

an output end of the frequency comparison module is connected to an input end of the carrier generation module via the limiter for comparing a frequency of the regulation signal and an initial switching frequency of the resonant converter, outputting a limiting signal after limitation of the limiter, and transmitting to the carrier generation module;

the carrier generation module is configured to generate a plurality of driving signals based on the limiting signal to drive the plurality of primary switches, respectively.

27. The resonant converter according to claim 26, wherein the carrier generation module comprises a carrier generation unit and a PWM generation unit, wherein the carrier generation unit is configured to generate a triangular carrier wave based on the limiting signal, and the PWM generation unit is configured to generate the plurality of driving signals based on the triangular carrier wave.

* * * * *